(12) United States Patent
Lee et al.

(10) Patent No.: US 6,424,530 B1
(45) Date of Patent: Jul. 23, 2002

(54) CLIP FOR HEAT SINK

(75) Inventors: Hsieh Kun Lee, Taipei (TW); Wellint Xia, Shenzhen (CN)

(73) Assignee: Foxconn Precision Components Co., Ltd., Taipei Hsien (JP)

( * ) Notice: Subject to any disclaimer, the term of this patent is extended or adjusted under 35 U.S.C. 154(b) by 0 days.

(21) Appl. No.: 09/833,912

(22) Filed: Apr. 12, 2001

(51) Int. Cl.[7] ................................................. H05H 7/20
(52) U.S. Cl. ....................... 361/704; 24/457; 24/458; 165/80.3; 165/185; 248/510; 174/16.3; 257/719; 257/722; 361/710
(58) Field of Search ............................... 165/80.2, 80.3, 165/185; 174/16.3; 248/505, 510; 257/718–719, 722; 361/704, 707, 709–710, 719–721; 24/457–459, 625

(56) References Cited

U.S. PATENT DOCUMENTS

| | | | | |
|---|---|---|---|---|
| 5,329,426 A | * | 7/1994 | Villani | 361/719 |
| 5,381,305 A | * | 1/1995 | Harmon et al. | 361/704 |
| 5,428,897 A | * | 7/1995 | Jordan et al. | 29/890.03 |
| 5,640,305 A | * | 6/1997 | Smithers | 361/719 |
| 5,730,210 A | * | 3/1998 | Kou | 165/80.3 |
| 5,818,695 A | * | 10/1998 | Olson | 361/719 |

FOREIGN PATENT DOCUMENTS

TW 86209116 * 5/1998

* cited by examiner

*Primary Examiner*—Gregory Thompson
(74) *Attorney, Agent, or Firm*—Wei Te Chung

(57) ABSTRACT

A clip (10) securing a heat sink (20) to a heat-generating device (40) for removing heat therefrom comprises a body (12) and a pair of arms (14, 16) extending from the body. The body is positioned in a groove of the heat sink, for pressing the heat sink against a heat-generating device. The body integrally forms a loop (122) which receives a fin (24) of the heat sink, for enhancing engagement of the clip with the heat sink. Hooks (142, 162) at ends of the arms engage with holes defining in a substrate (30) on which the heat-generating device is mounted, thereby securing the heat sink against the heat-generating device.

12 Claims, 3 Drawing Sheets

CLIP FOR HEAT SINK

BACKGROUND OF THE INVENTION

1. Field of the Invention

The present invention relates to a clip for a heat sink, and particularly to a clip which comprises a loop integrally formed therein.

2. Description of Related Art

A typical heat sink assembly used for a heat-generating device, such as a chip, or a central processing unit (CPU), generally comprises a heat sink and an elongated clip separable from the heat sink. The clip is bent from a metal rod and is positioned in a groove of the heat sink. The clip typically engages with catches of a socket on which the CPU is mounted. Thus the heat sink is secured to a top surface of the CPU. Precise positioning between the clip and the heat sink is important. Clips which are too weak cannot firmly secure the heat sink to the CPU. This lowers the efficiency of heat removal. Clips which are too strong can damage the CPU. It is very difficult to attain a clip having suitable strength.

Various attempts have been made to develop suitable clip apparatuses. For example, a clip is secured to a heat sink by positioning a central body portion of the clip in an attachment clamp. The clamp comprises a hollow semi-cylindrical seat for receiving the central body portion, and ears extending from opposite sides of the seat. The ears are compressed and positioned in a groove of the heat sink. The clamp is thereby securely attached between fins of the heat sink. The clip has an elongated body and a pair of arms extending perpendicularly from opposite ends of the body, in generally opposite directions. The ends of the arms engage in receiving portions of a socket on which the CPU is mounted. The heat sink is thereby secured to the CPU. The clip remains in a fixed position relative to the heat sink. The clip and the heat sink resist vibration and shock encountered during normal operation.

The main shortcoming of the abovementioned clip and clamp apparatus is the simple fact that an additional component, namely the clamp, is required. This necessitates additional manufacturing costs, and unduly complicated installation. Examples of such clip and clamp apparatuses are disclosed in U.S. Pat. Nos. 5,640,305 and 5,428,897, and Taiwan Patent No. 86209116.

Thus, an improved clip which overcomes the above-mentioned problems is strongly desired.

SUMMARY OF THE INVENTION

Accordingly, an object of the present invention is to provide a clip having enhanced engagement with a heat sink, for securing the position of the clip relative to the heat sink.

A further object of the present invention is to provided a clip which is economical to manufacture and easy to install.

In order to achieve the objects set out above, a clip of the present invention includes a body and a pair of arms. The arms extend perpendicularly from opposite ends of the body, in generally opposite directions. The body is positioned in a groove of the heat sink, for pressing the heat sink against a heat-generating device. The body integrally forms a loop which receives a fin of the heat sink, for enhancing engagement of the clip with the heat sink. Hooks at ends of the arms engage with holes defining in a substrate on which the heat-generating device is mounted, thereby securing the heat sink against the heat-generating device.

Other objects, advantages and novel features of the invention will become more apparent from the following detailed description when taken in conjunction with the accompanying drawings.

DETAILED DESCRIPTION OF THE INVENTION

Figure 1:
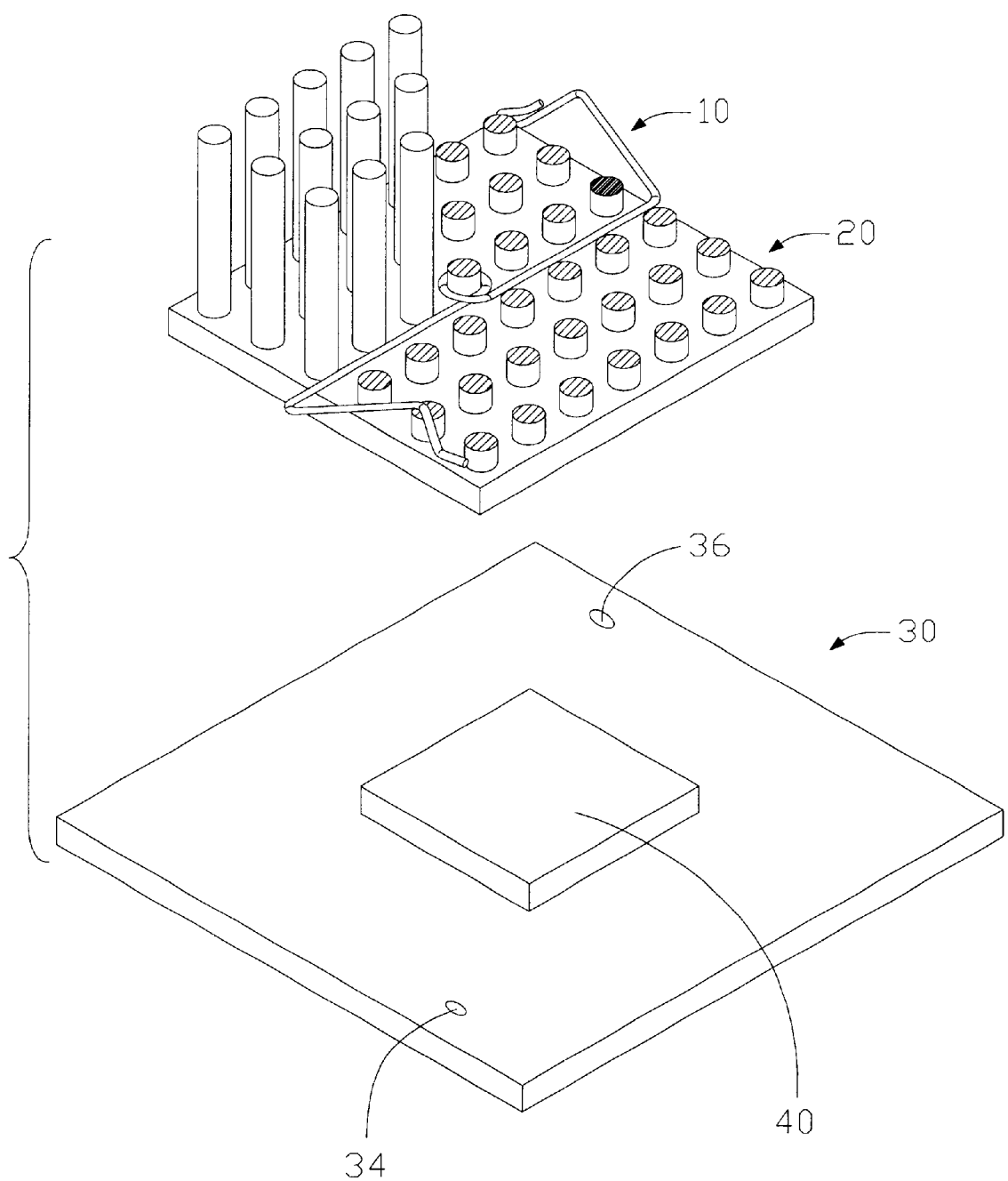
FIG. 1 is an exploded view of a clip of the present invention for attaching a heat sink to a chip mounted on a substrate, the clip partly installed on the heat sink, some fins on the heat sink being partly cut-away for clarity.

Reference will now be made to the drawing figures to describe the present invention in detail.

Referring to FIG. 1, a clip 10 of the present invention is coupled to a heat sink 20, for securing the heat sink 20 to a heat-generating device, such as a chip 40, mounted on a substrate, for example, a printed circuit board (PCB) 30. The heat sink 20 comprises a base 22 for mounting on the chip, and a plurality of fins 24 extending from a top surface of the base 22. The fins 24 are generally pillar-shaped, and are arranged in a regular rectangular array. Thus, a regular rectangular array of grooves (not labeled) is defined in the heat sink, each groove being defined between corresponding fins 24. The PCB 30 is a rectangular plate with the chip 40 mounted thereon. A pair of first and second through holes 34, 36 is defined in the PCB 30 and preferably located just outside opposing corners of the chip 40 final position. The second through hole 36 is slightly bigger than the first through hole 34.

Figure 2:
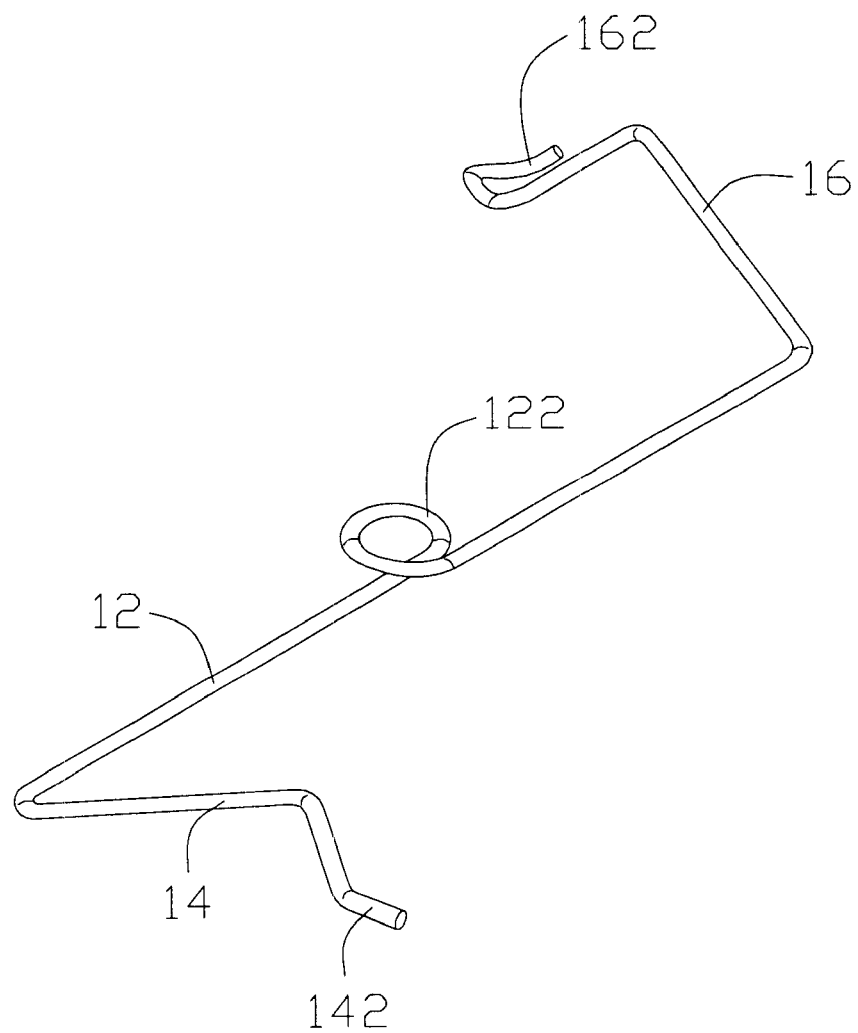
FIG. 2 is a perspective view of the clip of FIG. 1.

Referring particularly to FIG. 2, the clip 10 comprises an elongated body 12 and a pair of first and second arms 14, 16. The body 12 is substantially horizontal, and integrally forms a substantially horizontal and round loop 122 at a central portion thereof, for simplifying manufacture and installation of the clip 10. The loop 122 is dimensioned to receive a corresponding fin 24 of the heat sink 20, for enhancing engagement of the clip 10 with the heat sink 20. The arms 14, 16 extend perpendicularly from opposite ends of the body 12, in generally opposite directions. This makes the clip 10 substantially Z-shaped for creating torsion so that the arms 14, 16 can be bent to engage with the through holes 34, 36. A first hook 142 depends from a distal end of the first arm 14, for insertion into the first through hole 34 of the PCB 30. A second hook 162 depends from a distal end of the second arm 16, for corresponding to and being fitted into the second through hole 36 of the PCB 30.

Figure 3:
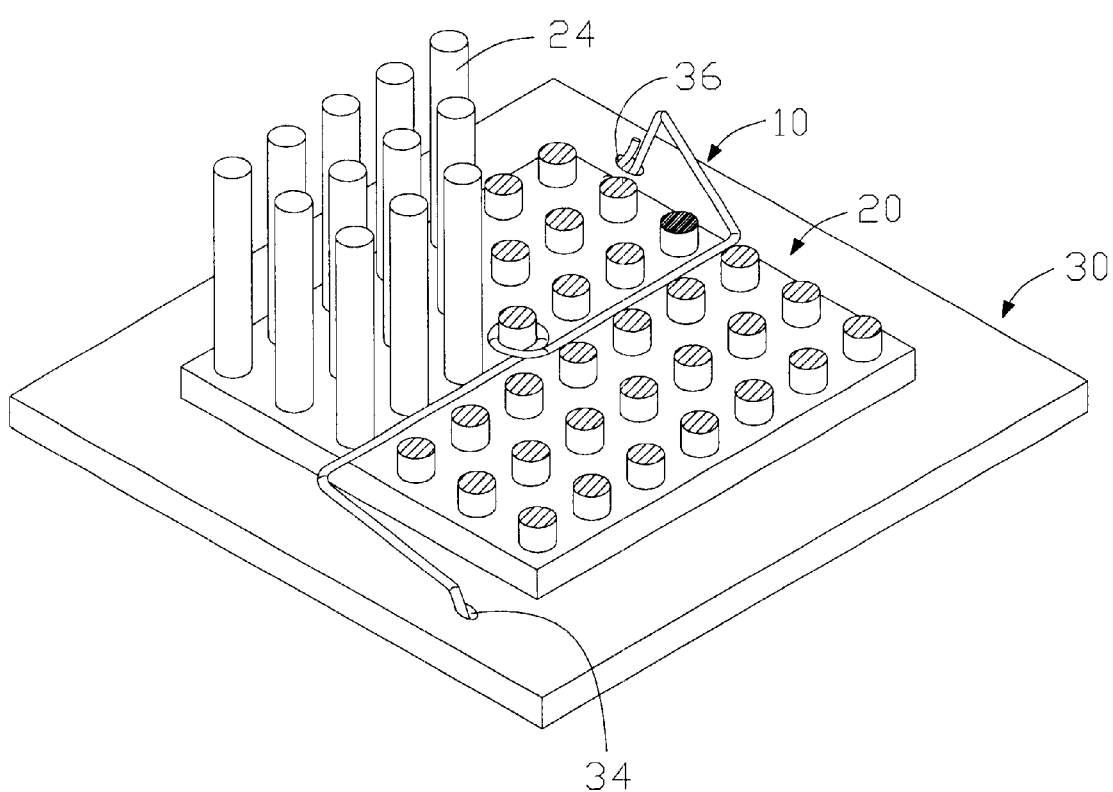
FIG. 3 is an assembly view of FIG. 1.

As shown in FIG. 3, the clip 10 secures the heat sink 20 to the chip 40 mounted on the PCB 30. The clip 10 is secured to the heat sink 20 by positioning the body 12 in a central groove (not labeled) of the heat sink 20, with the loop 122 of the clip fitting around a corresponding fin 24 of the heat sink 20, thereby securing the position of the clip 10 relative to the heat sink 20. The first hook 142 of the clip 10 is inserted into the first through hole 34 of the PCB 30. The second hook 162 of the clip 10 is then interferentially inserted into the second through hole 36 of the PCB 30, due to the torsion of the clip 10. Thus the body 12 firmly presses the heat sink 20 against the chip 40. Such installation is duly convenient.

The clip 10 of the present invention also can be used to engage with a socket supporting a heat-generating device, such as a central processing unit (CPU), thereon. The hooks 142, 162 of the clip 10 can engage with external ears of the socket, for securing the heat sink against the heat-generating device. For brief purpose, the detail description is omitted.

The clip 10 of the present invention has at least the following advantages:

1. The clip 10 has the loop 122 at the central portion thereof, for receiving the corresponding fin 24 of the heat sink 20. This secures the position of the clip 10 relative to the heat sink 20.
2. The loop 122 is integrally formed in the clip 10. This makes the clip 10 easy to operate, and results in lower costs.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A clip securing a heat sink to a heat-generating device for removing heat therefrom, comprising:

an elongated body positioned in a groove of the heat sink for pressing the heat sink against a heat-generating device, a loop integrally formed in the body for substantially abutting a corresponding fin of the heat sink, thereby enhancing engagement of the clip with the heat sink; and a pair of first and second arms extending from the body, first and second hooks respectively depending from the first and second arms, for interferentially engaging with a supporting device on which the heat-generating device is mounted and thereby securing the heat sink against the heat generating device.

2. The clip as described in claim 1, wherein the loop is substantially horizontally formed at a central portion of the body.

3. The clip as described in claim 1, wherein the arms are generally perpendicular to the body.

4. The clip as described in claim 1, wherein the arms extend from the body in generally opposite directions for creating torsion.

5. A heat sink assembly comprising:

a heat-generating device;

a substrate supporting the heat-generating device thereon, the substrate defining a pair of first and second through holes therein, the holes being located outside opposing corners of the device;

a heat sink mounted on the device, the heat sink comprising a base and a plurality of fins extending from the base, the fins forming a plurality of grooves; and a clip comprising a body received in a central groove of the heat sink for pressing the heat sink against a heat-generating device, and a pair of first and second arms engaged with the through holes of the substrate for securing the heat sink to the substrate, the body integrally forming a loop to substantially abut a fin of the heat sink, for enhancing engagement of the clip with the heat sink.

6. The heat sink assembly as described in claim 5, wherein the loop is substantially horizontally formed at a central portion of the body.

7. The heat sink assembly as described in claim 5, wherein the second through hole of the substrate is bigger than the first through hole of the substrate, for coupling with the corresponding second hook of the clip.

8. The heat sink assembly as described in claim 5, wherein a pair of first and second hooks respectively depends from the first and second arms, for interferential insertion into the corresponding through holes of the substrate.

9. The heat sink assembly as described in claim 5, wherein the fins of the heat sink are pillar-shaped.

10. The heat sink assembly as described in claim 9, wherein the fins of the heat sink are arranged in a regular array.

11. An electrical assembly, comprising:

a substrate defining two holes therein;

a chip mounted on the substrate between the two holes;

a heat sink mounted on the chip, said heat sink having a plurality of upwardly extending fins arranged in a plurality of rows; and a clip made of wire metal and comprising:

a substantially linear body received in the heat sink at a position between two rows of the fins;

a loop formed about a middle of the body, said loop fitting around one of fins at the two rows;

a pair of arms extending oppositely from two ends of the body, respectively; and a hook formed at a free end of each of the arms, said hook being forcedly fitted into a corresponding hole of the substrate whereby the clip exerting a pressing force against the heat sink toward the chip to cause the heat sink to have an intimate contact with the chip.

12. The electrical assembly in accordance with claim 11, wherein the fins each have a configuration of a round post, and the loop is a round loop.

* * * * *